(12) United States Patent
Selgrath et al.

(10) Patent No.: US 8,786,443 B2
(45) Date of Patent: Jul. 22, 2014

(54) RFID TAG FOR DIRECT AND INDIRECT FOOD CONTACT

(75) Inventors: Bernd Selgrath, Lebach-Steinbach (DE); Ian James Forster, Essex (GB)

(73) Assignee: Avery Dennison Corporation, Glendale, CA (US)

( * ) Notice: Subject to any disclaimer, the term of this patent is extended or adjusted under 35 U.S.C. 154(b) by 1336 days.

(21) Appl. No.: 12/393,082

(22) Filed: Feb. 26, 2009

(65) Prior Publication Data

US 2009/0212919 A1 Aug. 27, 2009

Related U.S. Application Data

(60) Provisional application No. 61/031,565, filed on Feb. 26, 2008.

(51) Int. Cl.
G08B 13/14 (2006.01)

(52) U.S. Cl.
USPC ............ 340/572.8; 340/572.1; 340/10.1; 156/64

(58) Field of Classification Search
USPC .......... 340/572.1–572.8, 10.1; 156/64, 277, 156/306
See application file for complete search history.

(56) References Cited

U.S. PATENT DOCUMENTS

| 5,528,222 | A | * | 6/1996 | Moskowitz et al. ....... 340/572.7 |
| 5,682,143 | A | * | 10/1997 | Brady et al. ............... 340/572.7 |
| 6,078,259 | A | * | 6/2000 | Brady et al. ............... 340/572.7 |
| 6,100,804 | A | * | 8/2000 | Brady et al. ............... 340/572.7 |
| 6,271,793 | B1 | * | 8/2001 | Brady et al. ............ 343/700 MS |
| 7,336,243 | B2 | * | 2/2008 | Jo et al. .......................... 343/895 |
| RE40,137 | E | * | 3/2008 | Tuttle et al. ..................... 438/19 |
| 2004/0046022 | A1 | * | 3/2004 | Hassan-Zade et al. ....... 235/435 |
| 2006/0117554 | A1 | * | 6/2006 | Herrmann et al. .............. 29/601 |
| 2008/0149731 | A1 | * | 6/2008 | Arai et al. ...................... 235/492 |
| 2008/0204246 | A1 | * | 8/2008 | Kates ......................... 340/572.1 |
| 2009/0033495 | A1 | * | 2/2009 | Abraham et al. ........... 340/572.1 |
| 2011/0168789 | A1 | * | 7/2011 | Kobayashi et al. ........... 235/492 |

FOREIGN PATENT DOCUMENTS

| DE | 10 2004 027 978 | 12/2005 |
| EP | 0 619 246 | 10/1994 |
| WO | 2005/071608 | 8/2005 |
| WO | 2006/101651 | 9/2006 |

OTHER PUBLICATIONS

International Search Report and Written Opinion dated May 13, 2009, issued in corresponding PCT/US2009/035207.

* cited by examiner

*Primary Examiner* — Eric M Blount
(74) *Attorney, Agent, or Firm* — Avery Dennison Corporation

(57) ABSTRACT

The present invention relates to an RFID device that is intended to be used in connection with direct or indirect packaging of consumer food products, such as with the use of food trays, totes and other transport packaging for perishable items. The RFID device may include a RFID inlay assembly that has been encased in a laminate that is safe for use with food products.

18 Claims, 3 Drawing Sheets

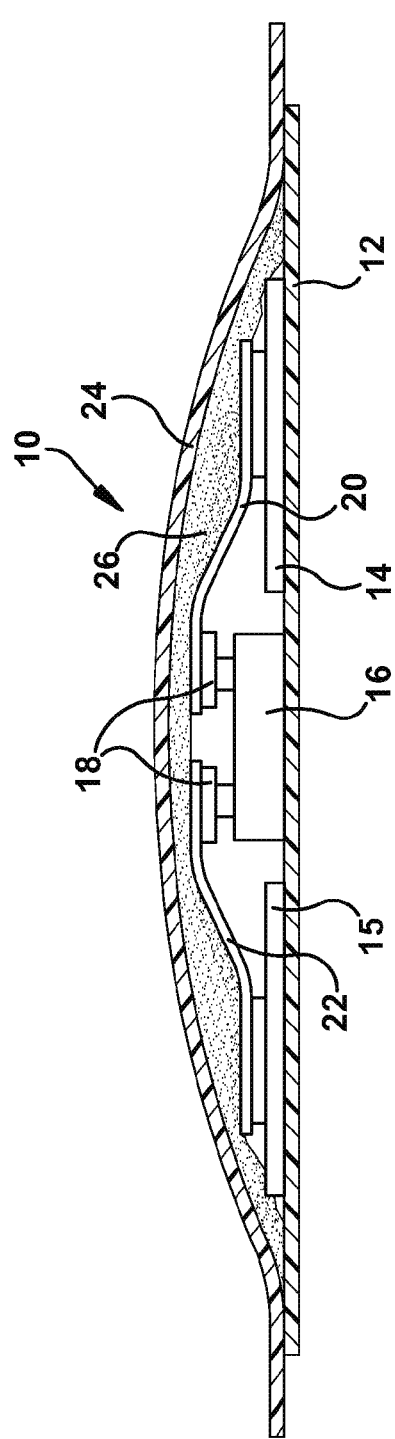
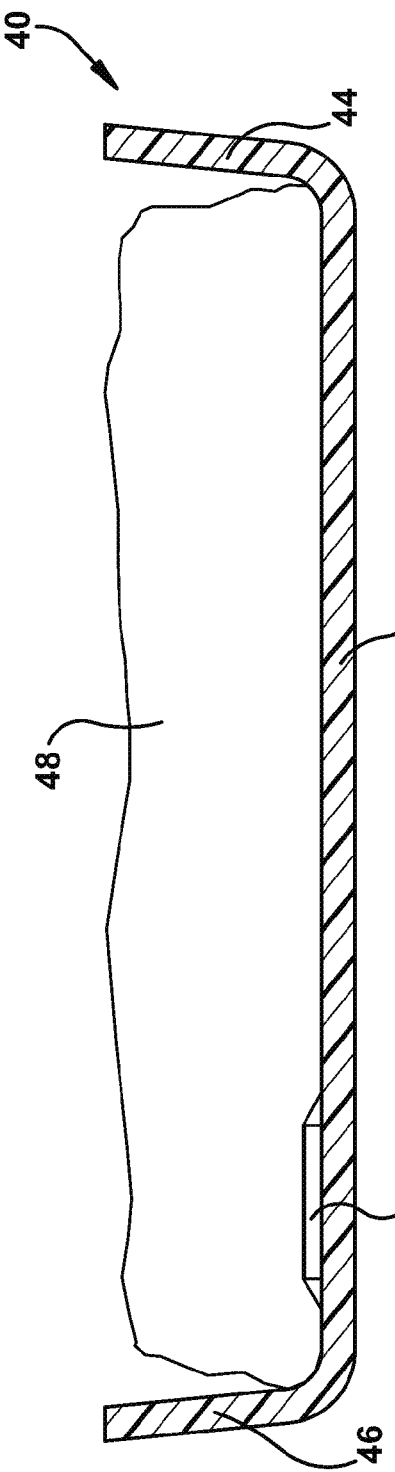
Fig. 1
Fig. 2

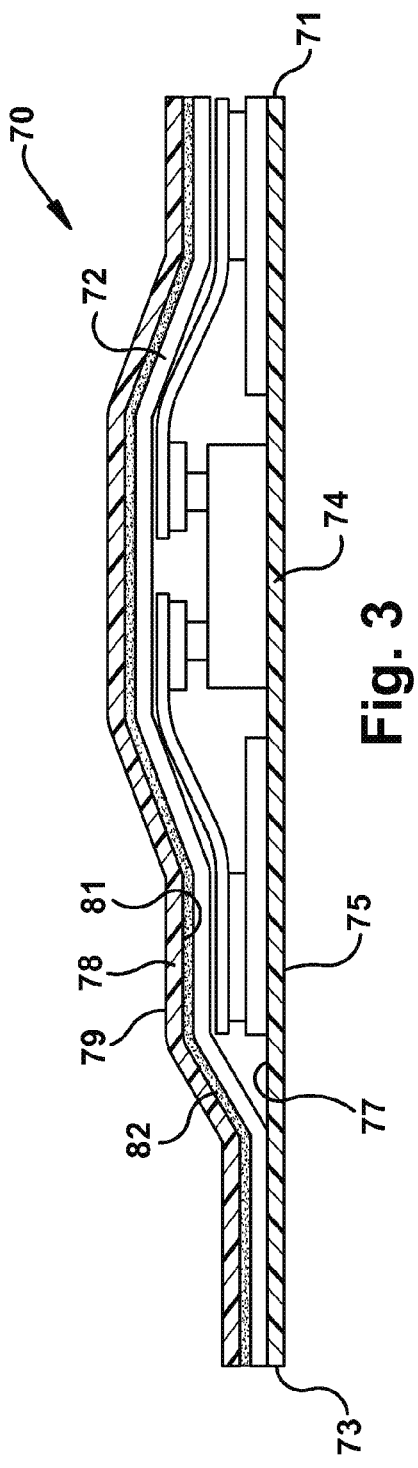
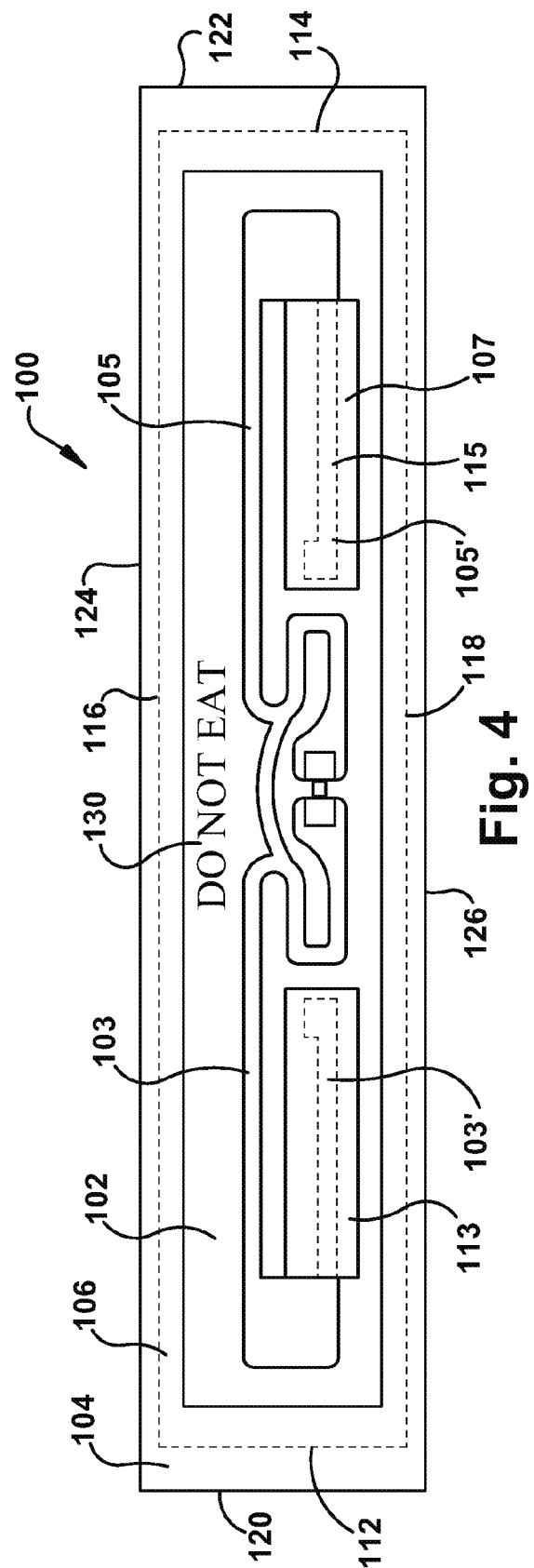

RFID TAG FOR DIRECT AND INDIRECT FOOD CONTACT

CROSS-REFERENCE TO RELATED APPLICATION

This application claims priority to U.S. Provisional Application No. 61/031,565, filed on Feb. 26, 2008, which is incorporated herein in its entirety.

FIELD OF THE INVENTION

The present invention is directed to the field of radio frequency identification ("RFID") tags and labels and more particularly to the use of RFID technology in area of direct and indirect food contact applications as may be used with the transportation, storage, handling, cooking and movement of perishable items such as consumer food products.

BACKGROUND OF THE INVENTION

Radio frequency identification (RFID) tags and labels (collectively referred to herein as "devices") are widely used to associate an object with an identification code. RFID devices generally have a combination of antennas and analog and/or digital electronics, which may include for example communications electronics, data memory, and control logic. For example, RFID tags are used in conjunction with security locks in cars, for access control to buildings, and for tracking inventory and parcels.

As noted above, RFID devices are generally categorized as labels or tags. RFID labels are RFID devices that are adhesively or otherwise have a surface attached directly to objects. RFID tags, in contrast, may be secured to objects by other means, for example by use of a plastic fastener, string or other fastening means. RFID devices can also include inlays which are an RFID device in an intermediate configuration which must then undergo one or more manufacturing operations in order to complete the RFID tag, label or finished RFID device.

RFID devices may include active tags and labels, which include a power source (such as a battery), and passive tags and labels, which do not. In the case of passive RFID devices, in order to retrieve the information from the chip, a "base station" or "reader" sends an excitation signal to the RFID tag or label. The excitation signal energizes the tag or label, and the RFID circuitry transmits the stored information back to the reader. The RFID reader receives and decodes the information from the RFID tag. In general, RFID tags can retain and transmit enough information to uniquely identify individuals, packages, inventory and the like.

RFID tags and labels also can be characterized as to those to which information is written only once (although the information may be read repeatedly), and those to which information may be written during use. For example, RFID tags may store environmental data (that may be detected by an associated sensor), logistical histories, state data, etc.

Many items in the marketplace are packaged, singly or in bulk, in a container for shipping and/or storage. The manufacturers, distributors, retailers, and/or customers may wish to monitor or identify the containers at various points throughout the distribution chain of the items. For example, and as will be referenced throughout for illustrative purposes, pharmaceutical manufacturers commonly package pills or liquids in bottles. It should be understood however, that a variety of other consumer goods, such as personal care products, human and animal consumable food products, dietary supplements, and the like, can be packaged in containers.

Containers that provide consumer food products may also be used in the preparation of the food such as with cooking. Metal that may be contained in such containers can be problematic in that microwave energy can cause sparking of the metal portions causing uneven cooking of the food, spoilage or appliance fires.

In the transport and distribution of consumer goods, various tamper evident solutions have been proposed. While these solutions have become quite sophisticated over time, they still may not be able to provide the consumer with an adequate chain of custody. Therefore, it is important for a consumer to have some assurance that the contents of the container are in their original condition as intended by the manufacturer and that in the event of a problem with the container, the manufacturer and other relevant information related to the product can be quickly provided to the investigator so that the problem may be readily dealt with. In addition, it is important to track the progress of a food container so that integrity of the product can be assured for the consuming public.

BRIEF SUMMARY OF THE INVENTION

The embodiments of the present invention described below are not intended to be exhaustive or to limit the invention to the precise forms disclosed in the following detailed description. Rather, the embodiments are chosen and described so that others skilled in the art may appreciate and understand the principles and practices of the present invention.

Radio Frequency Identification (RFID) labels, tags and devices are used in a wide range of application environments. A typical RFID tag can include an RFID inlay having a circuit device, (hereinafter, "RFID inlay") that is mounted on a substrate or carrier, to which can be applied a face stock, adhesive or other materials in order to finish the construction of the device. The RFID device after it has been manufactured to its final form is then used in a direct or indirect food packaging applications to track and distribute consumer food products to warehouse or retail environments.

In one exemplary embodiment to be used in connection with the present invention, an RFID device is disclosed that is contemplated for use with direct or indirect food packaging applications. The RFID device includes an RFID inlay that has a chip which is encoded with product information. The chip is then bonded to an antenna, typically composed of metal such as copper, aluminum, or silver.

The presently described embodiment also includes first and second substrates, with each of the substrates having first and second surfaces. Each of the substrates have first and second transversely extending edges and first and second longitudinally extending sides. The substrates are selected from a listing of GRAS materials.

The RFID inlay of the presently described embodiment is disposed between each of the first and second substrates. The RFID inlay is enclosed between the two substrates by sealing the first and second transversely extending edges and first and second longitudinally extending sides to one another so as to create a sealed enclosure for the RFID inlay.

In a further exemplary embodiment of the present invention, a consumer food tray for transporting consumer food goods, is described and includes a tray that has a base with first and second sides. The base has end walls that encircle the base and which extend generally upwardly from said base. The tray is used for transporting and at least temporarily holding a consumer food good.

The presently described embodiment includes an RFID device. The RFID device comprises an RFID inlay. The RFID inlay has a chip encoded with product information and an antenna that is bonded to the chip. The RFID device includes first and second GRAS substrates each of the first and second substrates has first and second surfaces. The inlay is disposed between the first surface of the first substrate and the second surface of said second substrate. The RFID device is in contact with the consumer food good such as by adhesively adhering the RFID device to a consumer food tray and then laying the food good in the tray over the RFID device.

In a yet still further exemplary embodiment of the presently described invention, GRAS RFID device is provided and includes a first laminated structure that has an integrated circuit (IC) or chip which is encoded with product information relates to a consumer good. The integrated circuit is connected to an antenna via a conductive adhesive bond and the antenna and the integrated circuit is disposed between first and second substrates to create a first laminate assembly.

Continuing with a discussion of the presently described embodiment, a second structure that has first and second GRAS films is provided with each of said first and second GRAS films having first and second end edges and first and second side edges. The first laminated assembly of this embodiment is disposed between the first and second GRAS films to create a second laminated assembly that may be attached to a tray or tote that is used for handling consumer food goods and which may come into direct or indirect contact with a food item.

In addition to the foregoing embodiments presented above, additional embodiments may include having at least one of the films being larger in surface area than the other. In addition, the IC or chip can be connected to the antenna by means of strap.

The present invention may also reduce or eliminate the sparking risks in microwave cooking, by eliminating or removing, such as by cutting away, a portion of the metal antenna or covering all or a portion of the antenna with a fire retardant or resistant material.

In a yet still further embodiment of the presently described invention, an exemplary method is provided for manufacturing the laminated assembly and for producing a GRAS RFID device to be used in connection with a food carrier. The method includes the steps of initially providing an RFID inlay which may be manufactured using a chip, strap or interposer. Then placing the RFID inlay on a first GRAS substrate. Next, the RFID inlay and the first GRAS substrate are covered with a second GRAS substrate. The first and second GRAS substrates are adhered together with the RFID inlay contained in between the first and second substrates to form a laminated assembly. Finally, the laminated assembly is affixed to a food carrier.

In addition to the foregoing method embodiment, additional steps such as encoding and testing may also be practiced.

These and other objects of the invention will become clear from an inspection of the detailed description of the invention and from the appended claims.

BRIEF DESCRIPTION OF THE DRAWINGS

These, as well as other objects and advantages of this invention, will be more completely understood and appreciated by referring to the following more detailed description of the presently preferred exemplary embodiments of the invention in conjunction with the accompanying drawings, of which:

FIG. 1 depicts a side elevation of the RFID device of the present invention;

FIG. 2 provides a side elevation of a consumer food tray having the RFID device of the present invention connected thereto;

FIG. 3 shows a side elevation of a further embodiment of the present invention in which first and second laminated assemblies are used to create an exemplary RFID device;

FIG. 4 illustrates a top view of the RFID device of the presently described invention.

DETAILED DESCRIPTION OF THE INVENTION

Figure 5:
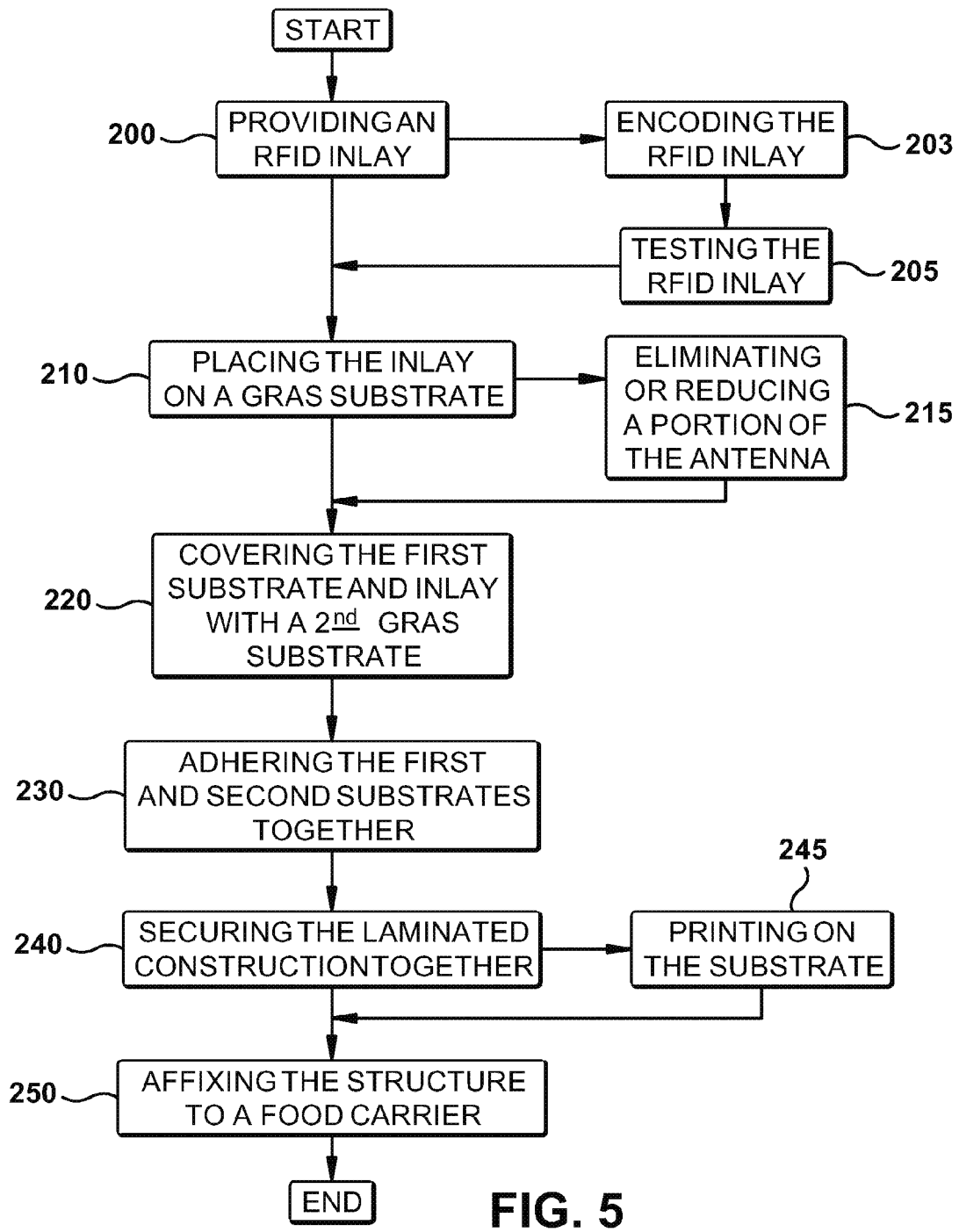
FIG. 5 presents a block diagram of an exemplary method practiced in accordance with the present invention.

The present invention is now illustrated in greater detail by way of the following detailed description which represents the best presently known mode of carrying out the invention. However, it should be understood that this description is not to be used to limit the present invention, but rather, is provided for the purpose of illustrating the general features of the invention.

In connection with the transport and distribution of consumer food items, the Food and Drug Administration ("FDA") has promulgated guidelines for direct and indirect food contact substances ("FCS") under 21 CFR Section 201. An FCS is defined "as any substance that is intended for use as a component of materials used in manufacturing, packing, packaging, transporting or holding food" (21 CFR Section 201). One or more FCS materials may be configured into a food contact article, which is a film, container, such as bottle, tote, box, carton or the like, or an article that is used in the manufacturing of food such as a mixing arm, tray, conveyor belt and the like. Use of certain FCS material in food packaging or transporting can be certified by the appropriate governmental agency, such as the FDA or may alternately be determined to be "GRAS" (generally recognized as safe), which means that the substance is generally recognized by experts as being safe in particular applications of use.

Exemplary films that may be used in connection with the present invention and which are believe to be GRAS include but are not limited to LDPE and PET. Adhesives that may be used in connection with the present invention that are believe to be GRAS include various starch based adhesives including those originating from corn, potato, rice and the like or other adhesives that may use a variety of other plant based oils and an exemplary material is available from FASSON® S200N.

FIG. 1 provides a cross sectional elevation of an exemplary RFID device as provided in connection with the presently described invention and depicted by reference numeral 10. The RFID device 10 includes a substrate 12 on which antenna portions 14 have been provided. The antenna portions 14 and 15 may be provided by printing a conductive ink, etching or placing a foil such as aluminum foil in patterns on the substrate 12. An integrated circuit (IC) or chip is also disposed on the substrate 12 and may be attached to the substrate 12 by an adhesive (not shown). The chip attach joints 18 are used to connect the chip 16 to the antenna portions 14, 15 by strap substrates 20 and 22. An exemplary RFID device can be obtained from Avery Dennison RFID Company, Clinton, S.C. under the tradename AD 222, AD 224.

A second substrate 24 is provided over the top of the chip 16 and strap substrates 20 and 22. The second substrate 24 is attached to the construction by adhesive 26 which is preferably a GRAS adhesive to create a laminated assembly that forms the RFID device 10. As can be seen from FIG. 1, the second substrate 24 extends beyond the end edges of the first substrate 12 so as to overlap the first substrate 12. The overlapping portions of the second substrate 24 can be then used to secure the laminated construction to the food carrier.

In addition to being adhesively bonded to one another, the first and second substrates 12 and 24 may be bonded to one another through the use of heat, pressure, ultrasonic energy or other suitable means to create a permanent enclosure.

Each of the first and second substrates 12 and 24, respectively, are provided with first and second end extending generally transversely and first and second sides that extend generally longitudinally as will be explained later in connection with the discussion relating to FIG. 4.

Turning now to FIG. 2, a food tray or tote 40 is shown having a base 42 and end walls 44 and 46 extending generally upwardly from the base 40. The depiction provided in FIG. 2 shows only first and second end walls 44 and 46, but it should be understood that the end walls may extend completely around the periphery of the base 42 of the food tray 40. A food product 48 is shown in the food tray 40 and generally in contact with the base 42 of the tray 40. The food product 48 can be any type of consumer food good or intermediate food good such as meat, bakery, dairy, or components used in any of the foregoing. FIG. 2 also shows that the food product 48 is directly in contact with RFID device 50 which is attached to the tray 40. The RFID device 50 may be attached to the tray 40 by adhesive (not shown), and preferably a GRAS adhesive or alternatively, the RFID device 50 may be affixed by sonic welding or other means. While the food product 48 is shown in direct contact with the RFID device 50, it should be understood that the food product 48 may be indirect contact with the RFID device such as in the case where the food product is for instance wrapped in packaging to provide a partial barrier between the food product and RFID device.

FIG. 3 provides a depiction of a further embodiment of the present invention in which a first laminated assembly, that shown in FIG. 1, is enclosed in a second envelope or laminated assembly as will now be discussed. The RFID device in FIG. 3 is referenced generally by numeral 70 which includes a first laminated assembly 72. The first laminated assembly 72 is produced in accordance with the description provided in FIG. 1, namely a RFID inlay is produced by connecting a chip to an antenna that is disposed on a substrate and then enclosed using a second substrate to cover over the top of the RFID inlay (chip, antenna, substrate). Inlays suitable for use with the present invention are available from Avery Dennison RFID Company, Clinton S.C. The chip may be provided in the form a strap (a chip with a connection element) and the RFID inlay may be manufactured in accordance with the manufacturing method provided in U.S. Pat. No. 6,951,596, which is incorporated herein by reference thereto and is commonly assigned with the instant application.

The RFID device 70 is provided with a first substrate 74 which has first and second surfaces 75 and 77, respectively. The RFID inlay 72 (the first laminated assembly) may be placed on the first substrate 74 second face 77. A second substrate 78 is provided. The second substrate 78 has first and second surfaces 79 and 81, respectively. The second substrate 78 is adhered to the RFID inlay 72 and first substrate 74 by an adhesive 82. The adhesive 82 may extend beyond the end edges 71 and 73 of the first substrate 74 so as to adhere the RFID device 70 to a food carrier as depicted in FIG. 2. Sealing the second substrate 78 to the first substrate 74 creates a second laminated assembly that contains the RFID inlay or first laminated assembly 72. In this manner, if the adhesive, such as conductive paste used in the manufacturing of the inlay is not GRAS approved, by enclosing the inlay in an envelope or laminated structure contamination of the food product is avoided. The second substrate 78, second surface or face 81 may also be coated with an opaque pigment or ink such as opaque white which enables the substrate surface to contain human or machine readable indicia, such as bar codes or warning indicia "DO NOT EAT.". The film making up the second substrate may also be opaque as opposed to overprinting or coating.

The second laminated assembly which is made up of the first and second substrates 74 and 78 in addition to being adhesively secured to the RFID inlay 72, may alternatively be bonded to the RFID inlay 72 through the use of heat, pressure, ultrasonic energy or other suitable means to create a permanent bond between the RFID inlay 72 and the first and second substrates 74 and 78.

Reference is now directed to FIG. 4 of the presently described invention in which an RFID device is depicted generally by reference to numeral 100. In this FIG. 4, inlay 102 is shown as being contained within a larger substrate 104 and a smaller substrate 106 which make up a second laminated assembly.

The RFID inlay 102 includes a strap 101 (chip and strap connection elements) connected to antenna elements 103 and 105. The RFID inlay 102 is disposed on a first substrate 107 which may be a paper or film such as PET. The RFID inlay 102 may be covered with a second substrate (not shown) to form a first laminated assembly (see FIG. 3). The RFID inlay 102, whether or not enclosed by a second substrate is placed on a first external substrate 106 which is preferably selected from a GRAS material such as LDPE or PET. The substrate 106 has first and second transversely extending end edges 112 and 114 and first and second longitudinally extending side edges 116 and 118.

A second external envelope substrate 104 is disposed over the top of the first substrate 106 such that the area of the second substrate 104 is larger than the area of the first substrate 106. As can be seen from the drawing FIG. 4, each of the transversely extending edges 120 and 122 and longitudinally extending sides 124 and 126 extend beyond the edges and sides of the first substrate. It should be understood that the second substrate 104 may only extend beyond the side edges, or end edges or both as shown in the drawing figure. An adhesive (not shown) is used to secure the second substrate 104 to the first substrate 106 and to the RFID inlay 102. In addition, adhesive is preferably used to secure the RFID device 100 to a carrier tray or the like and the adhesive is provided on the surface of the substrate 104 not in contact with the RFID inlay 102.

The second substrate 104 may also be pigmented such as with an opaque or white pigment which would enable the outer surface to be printed as illustrated by reference numeral 130. The printed indicia may take the form of human or machine readable information such as data codes or bar codes as well as useful information such as "do not eat" or "RFID Device" altering the consumer to possible risks associated with the device in the bottom of the tray.

Portions of the antenna 103 and 105, 103' and 105' respectively, may either be cut away or covered with a material 113, 115 to limit the read range of the device. Alternatively, the material 113 and 115 may be fire resistant or retardant material to prevent the aluminum antenna from sparking during the microwave treatment of the food package.

Attention is now directed to FIG. 5, which sets forth a block diagram depicting an exemplary embodiment of the present invention. Initially, a RFID inlay is provided at step 200. The inlay is produced preferably by applying a strap to a substrate that has an antenna pattern applied thereto. Next, the integrated circuit or chip can be encoded with product information at step 203. The inlay can be tested at step 205 to ensure that the information is encoded, and that the chip is receiving and transmitting satisfactorily.

Next, at step 210, the inlay is placed on a first GRAS substrate. The first GRAS substrate and inlay are covered by a second GRAS substrate at step 220. A portion of the antenna may be eliminated such as by cutting or alternatively covering the antenna with a material that is fire retardant or resistant at step 215. Then, at step 230 the first and second substrates are adhered together and at step 240 a laminated construction is formed with the inlay secured in between the first and second substrates. Finally, at step 250 the laminated structure is affixed to a food carrier. A consumer food product may then be brought into direct or indirect contact with the RFID device positioned on the food tray. At step 245 printing may be added to the second surface of the outer substrate envelope. The printing may occur by coating the second surface of the outer envelope with an opaque material or simply using an opaque film so that the printing will be visible.

It will thus be seen according to the present invention a highly advantageous RFID device to be used in the packaging and transport of consumer food items has been provided. While the invention has been described in connection with what is presently considered to be the most practical and preferred embodiment, it will be apparent to those of ordinary skill in the art that the invention is not to be limited to the disclosed embodiment, and that many modifications and equivalent arrangements may be made thereof within the scope of the invention, which scope is to be accorded the broadest interpretation of the appended claims so as to encompass all equivalent structures and products.

The inventors hereby state their intent to rely on the Doctrine of Equivalents to determine and assess the reasonably fair scope of their invention as it pertains to any apparatus, system, method or article not materially departing from but outside the literal scope of the invention as set out in the following claims.

What is claimed is:

1. An RFID device for use in direct or indirect food packaging applications, comprising;
    an RFID inlay having a chip encoded with product information and an antenna bonded to said chip and a portion of the antenna is covered with fire resistant or fire retardant materials;
    first and second substrates, each of said substrates having first and second surfaces, and first and second transversely extending edges and first and second longitudinally extending sides and each of said substrates being GRAS;
    wherein said RFID inlay is disposed between each of said first and second substrates and each of said first and second longitudinally extending sides and each of said first and second transversely extending edges are sealed to one another so as to create a sealed enclosure for said RFID inlay; and
    wherein said second substrate has an area that is greater than an area of said first substrate.

2. An RFID device as recited in claim 1, wherein said RFID device includes a GRAS adhesive to secure each of said first and second substrates to one another.

3. An RFID device as recited in claim 1, wherein said RFID inlay includes a strap connection from said chip to said antenna.

4. A GRAS RFID device, comprising:
    a first laminated structure having a integrated circuit encoded with product information relating to a consumer good, said integrated circuit connected to an antenna, said antenna and said integrated circuit disposed between first and second substrates to create a first laminate assembly;
    a second structure having first and second GRAS films with each of said first and second GRAS films having first and second end edges and first and second side edges; and
    wherein said first laminated assembly is disposed between said first and second GRAS films to create a second laminated assembly.

5. A GRAS RFID device as recited in claim 4, wherein the substrate and first and second surfaces and printing is provided on said second surface of said second substrate.

6. A GRAS RFID device as recited in claim 4, wherein said first laminated assembly is adhesively bonded to said second laminated assembly by a GRAS adhesive.

7. A GRAS RFID device as recited in claim 4, wherein said second GRAS film has an area greater than said first GRAS film and each of said first and second end edges and first and second side edges extend beyond each of said first and second end edges and first and second side edges of said first GRAS film.

8. A GRAS RFID device as recited in claim 4, wherein said integrated circuit is connected to said antenna by strap connection elements.

9. A GRAS RFID device as recited in claim 4, wherein said GRAS RFID device is attached to a consumer food transport item.

10. A GRAS RFID device as recited in claim 4, wherein said second laminated assembly is provided with printing.

11. A GRAS RFID device as recited in claim 4, wherein the first substrate is PET.

12. A GRAS RFID device as recited in claim 4, wherein one or both of the first and second films is/are LDPE.

13. A GRAS RFID device as recited in claim 4, wherein one or both of the first and second films is/are PET.

14. A GRAS RFID device as recited in claim 4, wherein the second substrate is attached by an adhesive.

15. A GRAS RFID device as recited in claim 4, wherein the adhesive is a GRAS adhesive.

16. A GRAS RFID device as recited in claim 4, wherein the first substrate has end edges, and the second substrate extends beyond the end edges of the first substrate.

17. A GRAS RFID device as recited in claim 4, wherein the first and second substrate are bonded to one another one of heat, pressure, or ultrasonic energy.

18. A GRAS RFID device as recited in claim 9, wherein the device is attached to the food transport item by a GRAS adhesive.

* * * * *